(12) United States Patent
Doe (10) Patent No.: US 7,265,337 B2
(45) Date of Patent: Sep. 4, 2007

(54) SENSING APPARATUS

(75) Inventor: Steve Doe, Deepcut (GB)

(73) Assignee: Nokia Corporation, Espoo (FI)

( * ) Notice: Subject to any disclaimer, the term of this patent is extended or adjusted under 35 U.S.C. 154(b) by 94 days.

(21) Appl. No.: 11/166,001

(22) Filed: Jun. 24, 2005

(65) Prior Publication Data

US 2006/0000966 A1    Jan. 5, 2006

(30) Foreign Application Priority Data

Jun. 30, 2004   (GB)   ................................ 0414574.4

(51) Int. Cl.
   *G01D 5/34*    (2006.01)
   *G01D 5/36*    (2006.01)
(52) U.S. Cl. ............................ 250/231.13; 250/231.18
(58) Field of Classification Search ........... 250/231.13, 250/231.18, 205
   See application file for complete search history.

(56) References Cited

U.S. PATENT DOCUMENTS 4,593,194 A * 6/1986 Graham et al. ........ 250/231.16
4,774,494 A * 9/1988 Extance et al. ................. 341/6
5,285,058 A * 2/1994 Goodwin ..................... 250/205
5,567,902 A * 10/1996 Kimble et al. ................. 84/658
5,748,181 A * 5/1998 Fu et al. ...................... 345/165
6,400,099 B1 * 6/2002 Walker ........................ 315/291
2002/0014581 A1* 2/2002 Yamamoto et al. ..... 250/231.13
2005/0263688 A1* 12/2005 Kauhanen .............. 250/231.13

FOREIGN PATENT DOCUMENTS

GB    2 396 407 A    6/2004

OTHER PUBLICATIONS transmission. (1992). In Academic Press Dictionary of Science and Technology. Retrieved Jan. 4, 2007, from http://www.xreferplus.com/entry/3170326.*

* cited by examiner

*Primary Examiner*—Georgia Epps
*Assistant Examiner*—Christopher M Yealy
(74) *Attorney, Agent, or Firm*—Harrington & Smith, PC

(57)    ABSTRACT

Motion sensing apparatus including at least one light sensitive electronic component, said component responsive to at least a first and second incident light level each level creating in said light sensitive component a first state and a second state, wherein the apparatus is configured to measure the response of the light sensitive component during the first state for at least one of the incident light levels and to compare the response with a previously recorded value.

24 Claims, 10 Drawing Sheets

FIG.11

SENSING APPARATUS

FIELD OF INVENTION

The invention relates to motion sensing apparatus. More particularly, the invention relates to determining movement of a member by means of the motion sensing apparatus.

BACKGROUND OF THE INVENTION

Electronic devices, for example a cellular handset, a personal digital assistant (PDA), a gaming console or other devices, may be used to handle information, interact with gaming elements and/or to access a communications network. A user will want to interact with the electronic device so as to make or receive calls, send or receive data or interact with software applications.

The electronic device may comprise a display, as would normally be the case for a cellular handset for the displaying of textual or graphical information. The electronic device may comprise a speaker for listening or communicating verbally. The electronic device may comprise a camera for taking images. The electronic device will comprise a user interface so that the user may operate the electronic device.

The functionality present in some electronic devices, for example a cellular handset is increasing, a cellular handset may now comprise a camera, a music player, gaming applications or media related applications. The electronic device must now support different functions and a user interface having only a traditional alphanumeric keypad is not best suited to provide a quick and easy interface between the user and the electronic device, Therefore some user interfaces provide additional input keys such as multi-way navigational key or cylindrical roller body keys, as outlined in EP0901262, which are better suited to navigating menu structures or interfacing with gaining applications. Such navigational keys require their movement or depression be sensed so that items displayed on a display may be activated or browsed.

Navigational keys such as the cylindrical roller key, as outlined in EP0901262, include a mechanical motion sensing means, which permits the user to rotate the key, which may result in a corresponding cursor movement on the display. However in portable electronic devices the overall dimensions must be relatively small to permit the user to carry the electronic device, hence other motion sensing apparatus utilising non mechanical motion sensing apparatus have been adopted.

Motion sensing apparatus as outlined in EP1431713 shows a photo-sensor, comprising a light emitting diode (LED) and a photo-detector, which may be a diode or transistor for the purpose of transmitting and receiving optical signals respectively. Photo-detectors are used for the detection of optical signals and for the conversion of an optical signal to an electrical signal.

The optical signal is directed from the LED to the rotary key input device such that it is reflected from the rotary key towards the photo-detector. The rotary key comprises a plurality of sectors on the surface upon which light is incident, each sector having either a reflective or absorptive characteristic such that as the rotary key is rotated differing amounts of light are received at the photo-detector. Typically, associated circuitry, which utilises the electrical signal from the photo-detector, possibly comprising passive elements such as resistors, biasing elements and transistors may then determine when the rotary key is being rotated by measuring the electrical signal from the photo-detector received over a time period or at a defined time interval and contrasting the measurement with a previous measurement or measurements. Ideally, the electrical signal measured by the associated circuitry due to reflected light from at least two different sectors has a sufficient differential or contrast ratio so that the associated circuitry can determine when the different sectors and therefore the rotary key is being rotated with respect to the photo-sensor. As the rotary key is being rotated the response from the photo-detector as a function of time may look like what is commonly referred to as a 'square wave' response. In response to this an electronic device may provide cursor movement on a display or menu browsing in dependence of the rotary movement.

However, the input device must be positioned so as to allow user interaction and will normally be positioned so that it allows freedom of movement, hence there will be an aperture between the electronic device mechanics and the input device near the surface of the mechanical construction of the electronic device. The aperture may allow ambient light to pass and interfere with the photo-detector resulting in an erroneous measurement. Furthermore the mechanical construction of the electronic device may be permeable to light or other EM waves. Ambient light or other EM waves may be able to pass through the mechanical construction and also interfere with the photo-detector. If the motion sensing apparatus is affected by ambient light or other EM waves then the photo-detector may have difficulty in determining when the rotary key input device is being rotated as it may have difficulty in distinguishing when light reflected from the rotary key has been reflected from a reflective or absorptive sector. The contrast ratio between the received light reflected from the two different sectors may be degraded, i.e. it becomes less.

An advantage of the present invention is that there is motion sensing apparatus for determining movement whereby the motion sensing apparatus output is proportional to the intensity of the input energy and said motion sensing apparatus may improve the contrast ratio of the detected energy for different incident energy levels to said motion sensing apparatus.

BRIEF DESCRIPTION OF THE INVENTION

According to one embodiment of the present invention there is motion sensing apparatus comprising at least one light sensitive electronic component, said component responsive to at least a first and second incident light level each level creating in said light sensitive component a first state and a second state, wherein the apparatus is configured to measure the response of the light sensitive component during the first state for at least one of the incident light levels and to compare the response with a previously recorded value;

According to another embodiment of the present invention there is motion sensing apparatus configured to be activated cyclically comprising at least one light sensitive electronic component, said component responsive to at least a first and second incident light level each level creating in said light sensitive component a first state and a second state, wherein the apparatus is configured to measure the response of the light sensitive component during the first state for at least one of the incident light levels and to compare the response with a previously recorded value;

According to a further embodiment of the present invention there is a method for determining motion in an apparatus having a light sensitive component having a plurality of input level dependant dynamic and substantially static states, the method comprising:

measuring a response from the motion sensing apparatus at a time corresponding with the dynamic phase of at least the first or second input signal;

comparing the response with a previously recorded value;

BRIEF DESCRIPTION OF THE DRAWINGS

The invention will now be described in further detail, by way of example only, with reference to the following examples and accompanying drawings, in which:

FIG. 5 shows the output of the motion sensing apparatus in response to incident light reflected from an absorptive surface FIG. 5a and a reflective surface FIG. 5b;

FIG. 7 shows the output of the motion sensing apparatus in response to incident light reflected from an absorptive surface FIG. 7a and a reflective surface FIG. 7b;

DETAILED DESCRIPTION OF THE PREFERRED EMBODIMENTS

Figure 1:
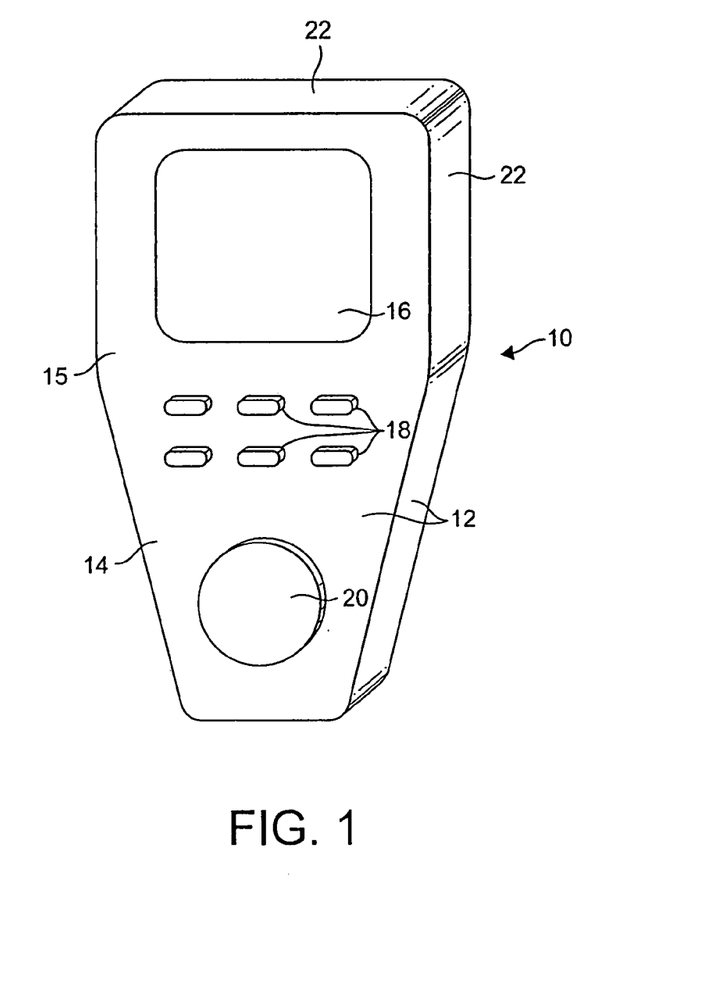
FIG. 1 shows an example of an electronic device in which embodiments of the invention may be implemented.

FIG. 1 illustrates an exemplary electronic device 10 which could utilise motion sensing apparatus in accordance with the present invention. A handheld cellular handset, comprising radio reception and transmission means (not shown) built into the casing 12 of the electronic device 10 and having an operational facia 14 coincidental with the front facia 15 of the electronic device 10. It is appreciated that a handheld cellular handset is one exemplifying electronic device 10 and further embodiments may include, but are not exclusive to, a personal digital assistant (PDA), gaming console, music player and digital camera.

The electronic device 10 further comprises a display 16 positioned towards the upper section of the operating facia 14 and input keys 18 positioned below the display 16. A rotary key 20 is positioned below the input keys 18 towards the lower section of the operating facia 14; the rotary key 20 is substantially planar and mounted such that it is perpendicular to its rotational axis, substantial movement of the rotary key being in a plane coincidental with the operational facia 14 of the electronic device 10.

In further embodiments, combinations of the above may be utilised, for example a music player may not have a need for additional input keys 18 as shown in FIG. 1. Furthermore, positioning and size of the display 16 and the keys 18,20 as shown in FIG. 1 are exemplary only and may be placed in totality or part on other facias 22 of the electronic device 10. The rotary key 20 can also be mounted beneath the operational facia 14, with part of the circumferential edge of the rotary key 20 accessible at the side of the electronic device 10.

Figure 2:
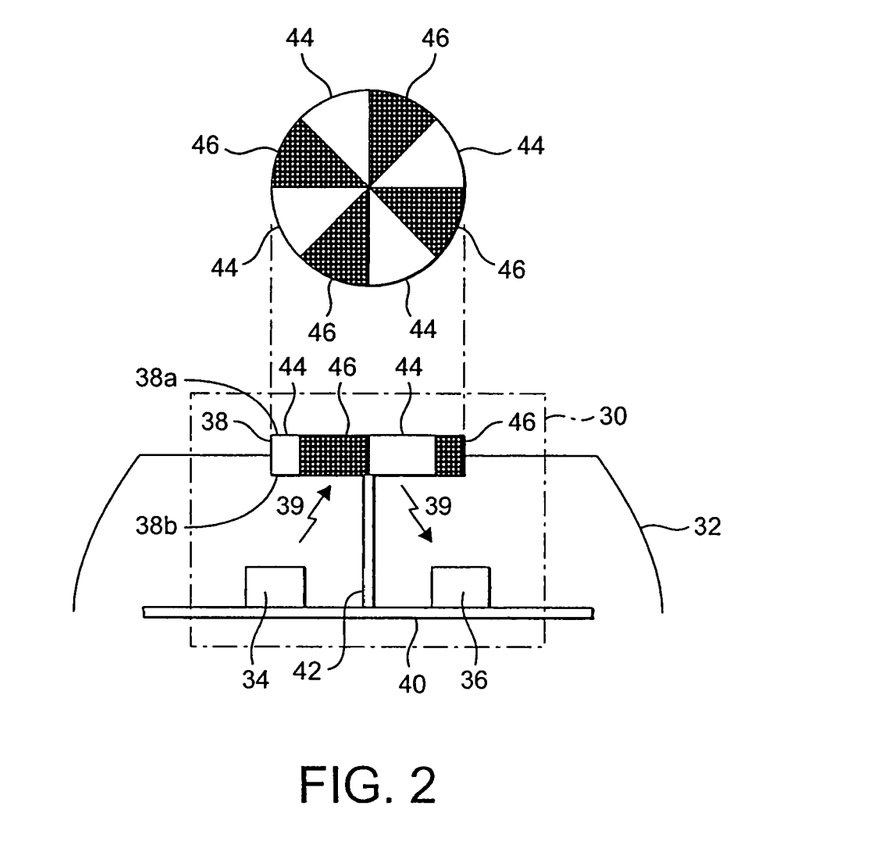
FIG. 2 shows an example of motion sensing apparatus comprising an optical signal.

FIG. 2 illustrates exemplary motion sensing apparatus in accordance with the present invention. The motion sensing apparatus 30 is substantially contained within the casing 32 of the portable electronic device. The motion sensing apparatus 30 comprising a transmit module 34 comprising, for example an LED 34 for the transmission of optical, infra-red (IR) or other electromagnetic (EM) waves; a reception module 36 comprising, for example a photo-detector for the reception of said waves and a rotary key 38 which reflects said waves from the transmit module 34 to the reception module 36 as illustrated by the transmission path 39. In accordance with the present invention the rotary key 38 may be any moveable member, for example a slideable key (not shown). The transmit 34 and reception module 36 will normally be positioned on a PCB 40 or other support structure (not shown) whereby electrical connections to associated circuitry (not shown) for example biasing circuitry, a processor or memory can be made to and from the said modules (not shown).

The rotary key 38 has two major surfaces, an upper surface 38a and a lower surface 38b, which in this embodiment are substantially planar and parallel to one another. The upper surface 38a may interface with a user; the rear surface 38b faces away from the user into the body of the electronic device 10. The rear surface 38b has a plurality of adjacent sectors 44, 46 in a repeating pattern; a first sector 44 having a substantially reflective characteristic and a second sector 46 having a substantially absorptive characteristic. The rotary key 38 is positioned above the transmit 34 and reception 36 modules such that optical, IR or EM waves may be reflected from its rear surface 38b. The rotary key is positioned such that the upper surface protrudes through the front facia 15 of the electronic device 10 of FIG. 1 to provide ease of movement to said user. The rotary key 38 may be supported by either a central stanchion 42 about which the rotary key 38 may rotate or by the casing 32 by means of a low frictional interface (not shown) between the casing 32 and the rotary key 38.

Other exemplary motion sensing apparatus (not shown) may comprise a input key located between the transmission and reception modules. The input key having adjacent transparent and opaque sectors where light or other EM waves may be attenuated by the opaque sectors when light is incident upon them as the input key is moved through the light path.

Figure 3:
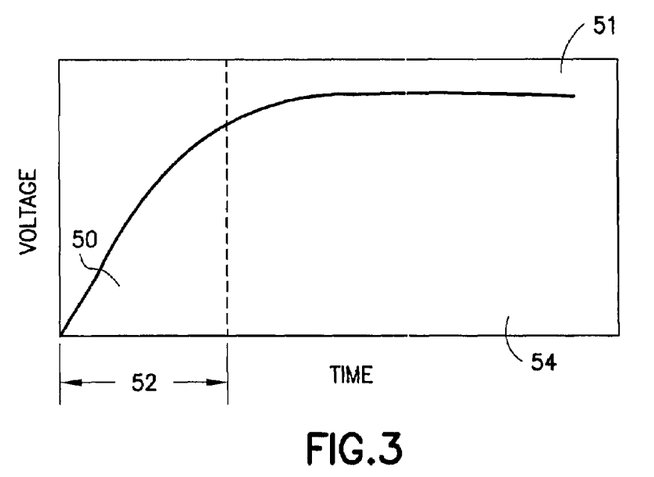
FIG. 3 shows an output of a photo-detector as a function of time.

The output of a typical reception sensor e.g. a photo-detector as a function of time is illustrated in FIG. 3. It can be seen that the response 51 of the photo-detector has two distinct phases, a transient phase 50 with an associated transient time 52 and an equilibrium phase 54, which occurs after the transient time 52. The transient time 52 being defined by those skilled in the art as the time taken for a device response to go from 10% to 90% of its final output value. The response 51 of the photo-detector therefore ramps in a substantially positive exponential fashion during the transient time 52 from a low output to approximately the final output value; the output value during the transient phase being dynamic, i.e. constantly changing. The transient time 52 is the time it takes for the photo-detector to respond correctly to incident light or other EM waves and is caused by the time it takes for light generated carriers, caused by incident light, within the body of the detector to arrive at and cross its P-N junction. The transient time 52 is dependant upon the internal structure of the detector and is in part due to the photo-detectors junction capacitance, determination of the transient time 52 is understood by those skilled in the art and no further consideration will be given.

The equilibrium phase 54 is substantially static i.e. the response 51 from the photo-detector does not change providing the biasing and or incident light level does not change.

It is usually advantageous for this transient time 52 to be minimised as it can be seen from FIG. 3 that the response 51 from the photo-detector during the transient phase 50 is erroneous. In systems employing photo sensitive components such as photodiodes or phototransistors measurements will be taken when the component has reached the equilibrium phase 54, i.e. following the transient time 52 when the output of the photo-detector is no longer in error for a given input incident light level. In motion sensing apparatus systems requiring an absolute output level for a given incident energy level it is therefore essential that the transient time be as low as possible so as to avoid any erroneous output as measurements cannot be taken during the transient phase 50. It is a further advantage of the proposed invention that the transient time 52 for the motion sensing apparatus need not be minimised.

Figure 4:
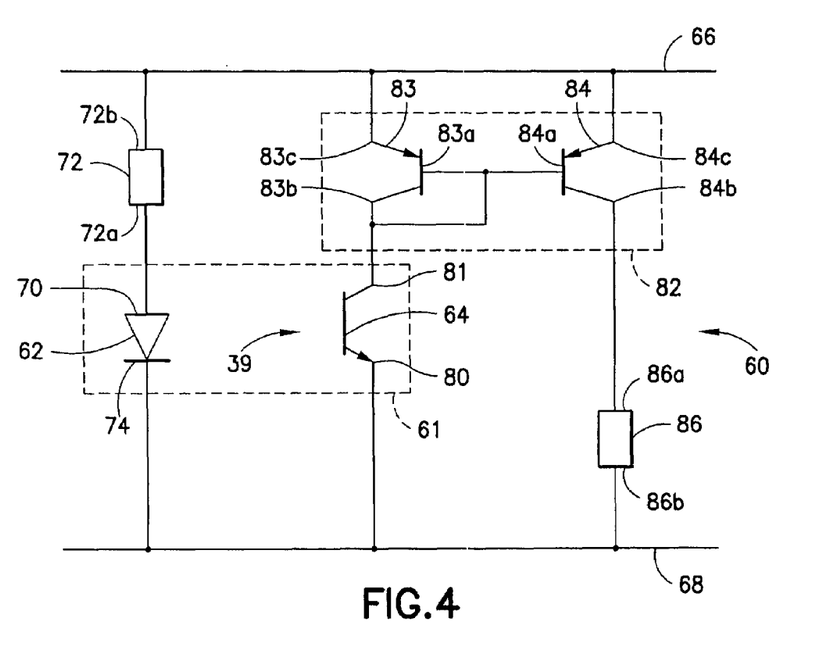
FIG. 4 shows associated circuitry of the motion sensing apparatus.

FIG. 4 shows exemplary biasing circuitry 60 which may be used with the motion sensing apparatus 30 illustrated in FIG. 2. The circuitry comprises a photo-sensor module 61 comprising a light emitting diode (LED) 62 and phototransistor 64. In other embodiments the transmitting and reception elements need not be in the same package but may be separate components, as shown by the transmission 34 and reception 36 modules in FIG. 2. For clarity the rotary key 38 of FIG. 2 has not been included but the transmission path 39 shown in FIG. 4 is the same as that illustrated in FIG. 2. There is also provided a supply voltage terminal 66 and a ground terminal 68. The anode 70 of the LED 62 is connected to one terminal 72a of a resistor 72, the second terminal 72b of the resistor 72 is connected to the supply voltage terminal 66. The cathode 74 of the LED 62 is connected to the ground terminal 68.

The phototransistor 64 has an emitter terminal 80, which is connected directly to the ground terminal 68 and a collector terminal 81, which is connected to what is known by persons skilled in the art as a current mirror 82. The current mirror 82 is used for providing equal current flow along two electrical connections. Its inclusion within the biasing circuitry 60 is not essential to the invention, so its purpose will only be explained briefly. The current mirror 82 comprises two transistors, a first pnp transistor 83 and a second pnp transistor 84. The first 83 and second transistors 84 having a base terminal 83a 84a; a collector terminal 83b 84b and an emitter terminal 83c 84c respectively. The base terminals 83a 84a are connected together. The collector terminal 83b and the base terminal 83a are connected, as is the collector terminal 81 of the phototransistor 64; the emitter terminal 83c is connected to the supply voltage terminal 66. The emitter terminal 84c of the second transistor 84 is also connected to the supply voltage terminal 66. The collector terminal 84b of the second transistor 84 is connected to a first terminal 86a of a resistor 86; the second terminal 86b of the resistor 86 is connected to ground 68. The purpose of the current mirror 82 within this circuit is to provide that the same current flowing through the collector terminal 81 of the phototransistor 64 also flows through the resistor 86. The purpose of the current mirror is to provide a voltage output across the resistor 86. It will be appreciated that this circuit could be omitted from any biasing circuitry 60 in conjunction with the proposed invention, for example a voltage output could be taken at the collector terminal 81 of the photo-transistor 64 with the addition of a resistive component or the current mirror 82 may be replaced by a diode element (not shown) or have additional resistive elements placed between it and the voltage supply terminal 66.

FIG. 5 illustrates the output voltage response of the motion sensing apparatus of FIGS. 2 and 4 between the first terminal 86a of the resistor 86 and the ground terminal 68 of FIG. 4.

Figure 5A:
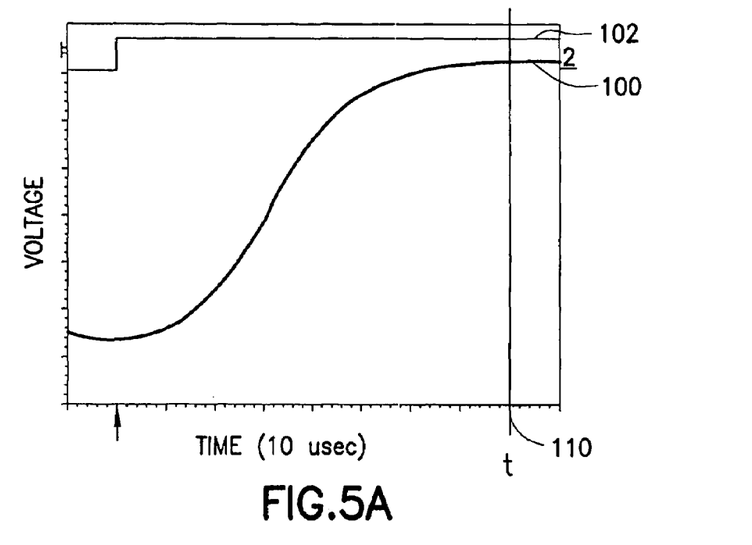

FIG. 5a illustrates a first output 100 of the motion sensing apparatus when transmitted light from the LED 62 of FIG. 4 has been reflected from an absorptive sector 46 of the rotary key 38 of FIG. 2 and is incident upon the phototransistor 64 of FIG. 4. It can be seen that the output of the phototransistor 64 does not reach a substantially static value, previously called the equilibrium phase 54 of FIG. 3 until after approximately 400 usecs. The output voltage in the equilibrium phase is approximately 130 mV. Also illustrated is a biasing voltage 102 of approximately 3.6V, which is present on the voltage supply terminal 66 of FIG. 4; the purpose of which is to provide a voltage across the LED 62 of FIG. 4 so that it emits an EM wave.

Figure 5B:
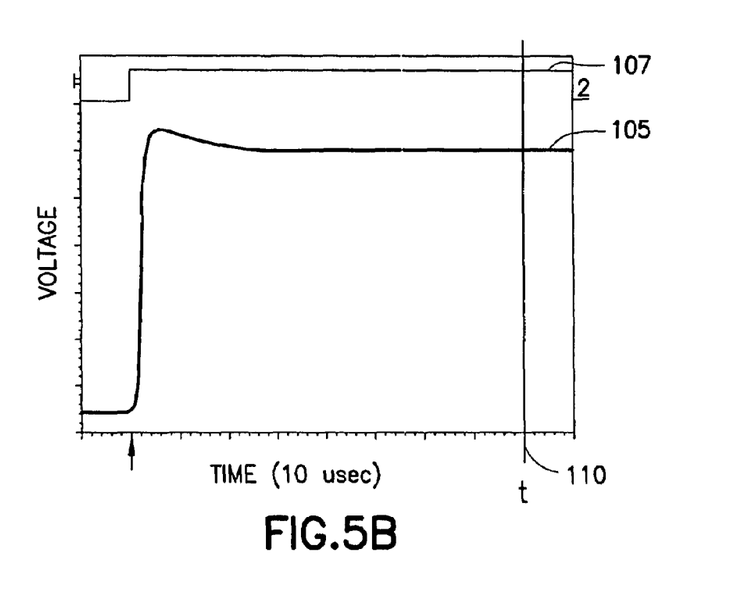

FIG. 5b illustrates a second output 105 of the motion sensing apparatus when transmitted light from the LED 62 of FIG. 4 has been reflected from a reflective sector 44 of the rotary key 38 of FIG. 2 and is incident upon the phototransistor 64 of FIG. 4. It can be seen that the output of the detector does not reach a substantially static value, previously called the equilibrium phase 54 of FIG. 3 until after approximately 50 usecs. The output voltage in the equilibrium phase is approx. 2.0 V. Also illustrated is a biasing voltage 107 of approximately 3.6V, which is present on the voltage supply terminal 66 of FIG. 4; the purpose of which is to provide a voltage across the LED 62 of FIG. 4 so that it emits an EM wave.

Contrasting the first output 100 of FIG. 5a and the second output 105 of figure 5b it can be seen that the difference or contrast ratio between the two output levels of the motion sensing apparatus 30 in response to incident light being reflected from a reflective or absorptive sector is approximately 15:1. This contrast ratio is measured at time t 110, which is approximately alter 400 usecs from the sensing apparatus being activated; measured after the output of the detector has reached a substantially static value. FIGS. 5a and 5b further illustrate that the response time of the motion sensing apparatus 60 is dependant upon the magnitude of the input incident light.

Figure 6:
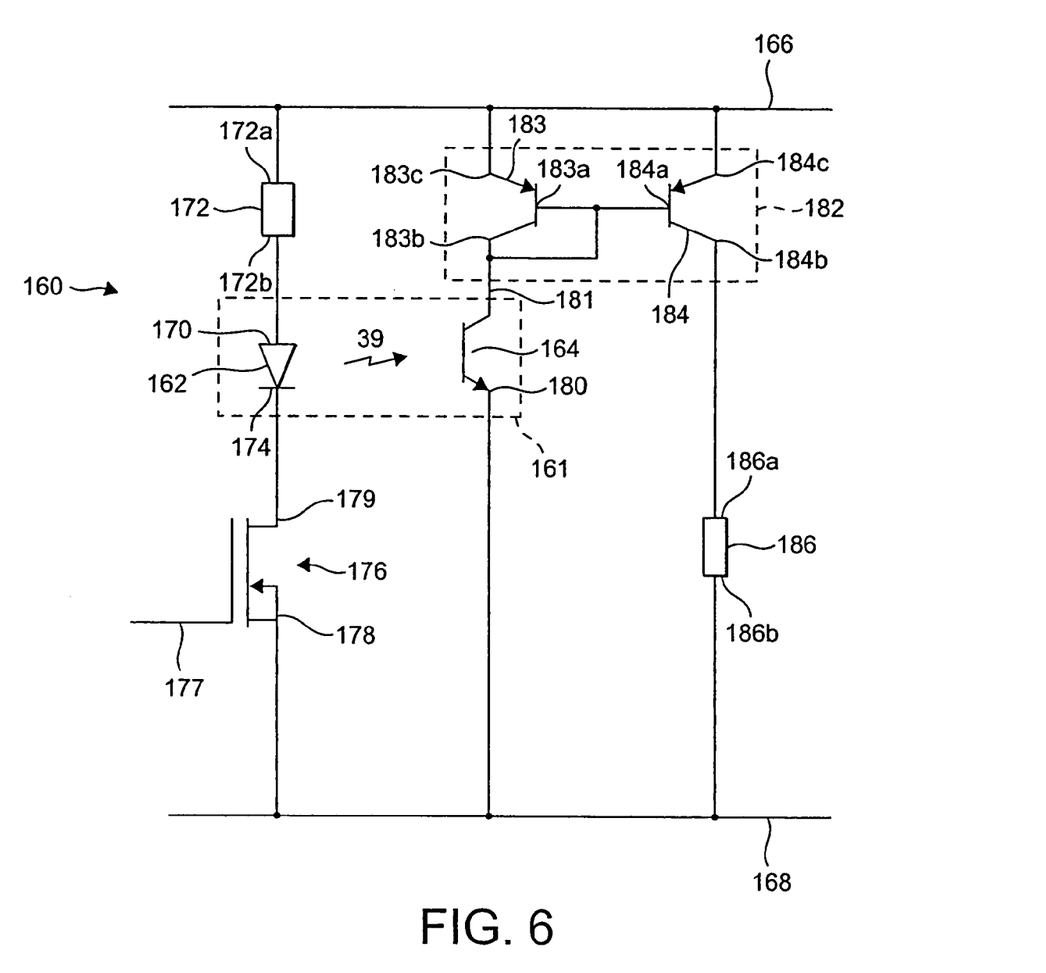
FIG. 6 shows associated circuitry of the motion sensing apparatus in accordance with the present invention.

FIG. 6 shows exemplary biasing circuitry 160 which can be used with the motion sensing apparatus 30 illustrated in FIG. 2 in order to describe the present invention. The reference numerals 60-90 of FIG. 4 have corresponding reference numerals 160-190 in FIG. 6. The photo-sensor 161 as previously described with reference to FIG. 4 has a LED 162 with an anode 170 and a cathode 174. By applying a voltage at the supply voltage terminal 166 a voltage may beapplied across the LED 162 and may transmit an EM wave for subsequent reception by the phototransistor 164. In addition to the circuitry shown in FIG. 4, a Field Effect Transistor (FET) 176 has been included in the biasing circuitry 160.

The FET 176 has three terminals, a gate 177, a source 178 and a drain 179. The drain 179 of the FET 176 is connected to the cathode 174 of the LED 162, the source 178 of the FET 176 is connected to ground terminal 168. The FET 176 is used like a switch, when the FET 176 is activated by means of applying a biasing signal to the gate 177 there is an electrical short circuit between the drain 179 and the source 178, hence when the FET 176 is activated current will flow between the voltage supply terminal 166 and the ground terminal 168 via the LED 162. The LED 162 will have a voltage applied across it and it will begin to transmit an EM wave. When the FET 176 is not activated, i.e. there is an open circuit between the source 178 and the drain 179 no current will flow between the voltage supply terminal 166 and the ground terminal 168 via the LED 162. There will therefore be no voltage across the LED 162 and no EM wave will be transmitted. It will be appreciated by those skilled in the art that other switching elements, e.g. a bipolar transistor (not shown) could be used in order to generate a voltage across the LED 162.

By contrasting the biasing circuitry 160 of FIG. 6 with the biasing circuitry 60 of FIG. 4 it will be appreciated that in order to activate the LED 62 of FIG. 4 a voltage has to be applied to the supply voltage terminal 66. The biasing circuitry 160 of FIG. 6 illustrates that applying a voltage to the supply voltage terminal 166 is not sufficient to activate the LED 162, there must also be activation of the FET 176. Activation of the LED 162 can therefore be achieved by applying a suitable biasing signal to the gate 177 of the FET 176 or the supply terminal 166 either simulataneously or when either is biased while the other has been previously biased.

FIG. 7 illustrates the output voltage response of the motion sensing apparatus of FIGS. 2 and 6 between the first terminal 186*a* of the resistor 186 and the ground terminal 168 of FIG. 6.

Figure 7A:
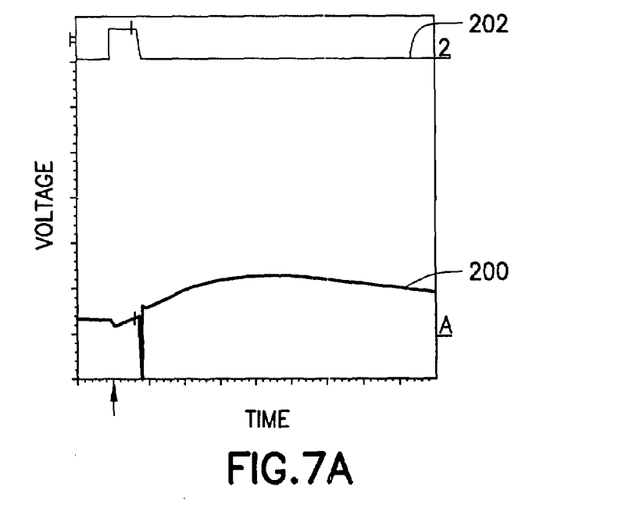

FIG. 7*a* illustrates a first output 200 of the motion sensing apparatus 30 of FIG. 2 when transmitted light from the LED 162 of FIG. 6 has been reflected from an absorptive sector 46 of the rotary key 38 of FIG. 2 and is incident upon the phototransistor 164 of FIG. 6. It can be seen that the output of the phototransistor 164 does not reach a substantially static value, previously called the equilibrium phase 54 of FIG. 3. The first output 200 reaches a maximum voltage of approx. 0.002V. Also illustrated is a control voltage 202 of approximately 3.6V, which is applied to the gate 177 of the FET 176 of FIG. 6. The control voltage approximates a square pulse of duration forty microseconds.

Figure 7B:
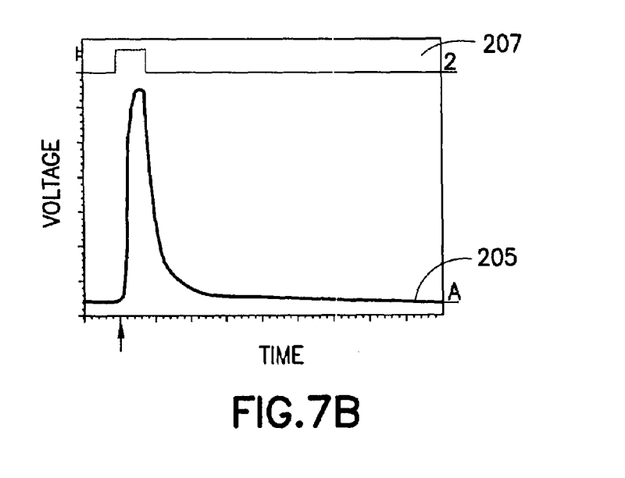

FIG. 7*b* illustrates a second output 205 of the motion sensing apparatus 30 of FIG. 2 when transmitted light from the LED 162 of FIG. 6 has been reflected from a reflective sector 44 of the rotary key 38 of FIG. 2 and is incident upon the phototransistor 164 of FIG. 6. It can be seen that the second output 205 of the phototransistor 164 reaches a peak value of approx. 2V. Also illustrated is a control voltage 207 of approximately 3.6V, which is applied to the gate 177 of the FET 176 of FIG. 6. The control voltage 207 approximates a square pulse of duration forty microseconds.

Contrasting the first output 200 of FIG. 7*a* and the second output 205 of FIG. 7*b* it can be seen that the difference or contrast ratio between the peak output levels of the motion sensing apparatus 160 in response to incident light being reflected from a reflective or absorptive sector is greater than a 1000:1.

It can be further seen that when the output is recorded during the gated pulse 202 207 for the two incident light levels the contrast ratio is increased further.

Contrasting the first output 100 of FIG. 5*a* and the first output 200 of FIG. 7*a* it can be seen that there is a substantial difference between the two peak output voltages, which are approximately 0.2V and 0.002 volts respectively. Contrasting the second output 105 of FIG. 5*b* and the second output 205 of FIG. 7*b* it can be seen that there is little difference between the two peak output voltages which are both approximately 2V.

It can be seen by contrasting the output responses of FIGS. 5 and 7 that the introduction of a switching element, i.e. the FET 176 of FIG. 6 and corresponding activation of the LED 162 for a time period by means of the control voltages 202, 207 of FIG. 7 applied to the gate 177 of the FET 176; an improved contrast ratio may result. Said control voltage 202, 207 being shorter in duration than the time needed for the motion sensing apparatus to achieve a static equilibrium state as illustrated in FIG. 5 for at least one of the incident input energy levels. An advantageous effect is observed namely that by not permitting the motion sensing apparatus 160 to achieve a static voltage output the contrast ratio may be improved, i.e. increased; resulting in the motion sensing apparatus becoming more immune to outside interference such as ambient light.

It will also be appreciated that a similar effect would occur if the biasing circuitry of FIG. 6 did not include the FET 176 and the voltage supply terminal 166 or the ground terminal 168 was enabled by the other switching circuitry. For example the gate pulse 202 of FIG. 7 applied to the FET 176 could as easily be a voltage pulse applied to the voltage supply terminal 166 in the absence of the FET 176 or in addition to the FET control voltage at gate terminal 177.

It will also be appreciated that other optical sensors such as photodiodes could replace the phototransistor 164 of FIG. 6. Similar biasing circuitry as that outlined in FIG. 6 could be used with a photodiode but it is appreciated by those skilled in the art that a photodiode is not as sensitive to optical frequencies as a phototransistor and further amplification and biasing circuitry may be needed.

Figure 8:
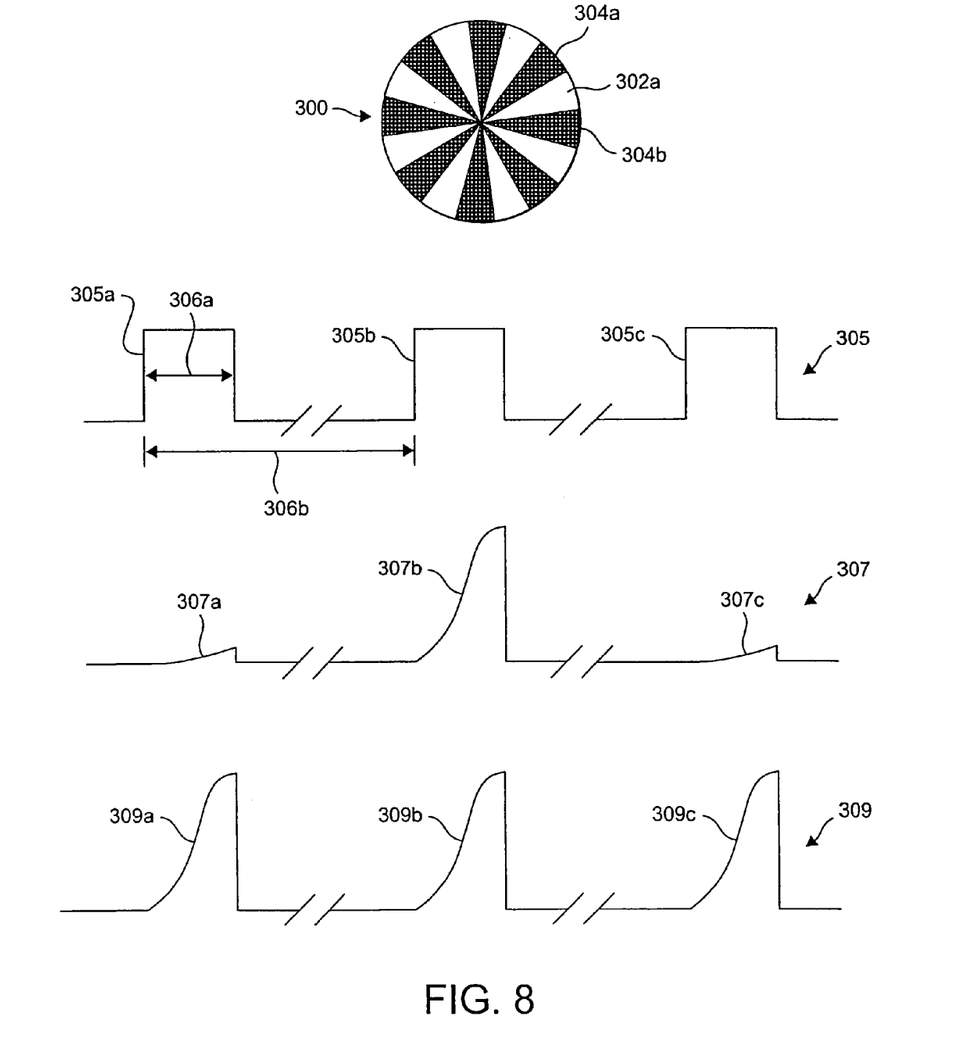
FIG. 8 shows output responses of the motion sensing apparatus in response to a rotary key being rotated.

Having outlined a means by which the contrast ratio between two incident energy levels may be improved application within an electronic device will now be explained. FIG. 8 shows the rear surface of a rotary key 300 comprising an alternating pattern; in this embodiment the pattern comprises substantially reflective 302 and substantially absorptive 304 areas but in alternative embodiments (not shown) said pattern may comprise sectors with alternating heights. The operation of the rotary key 300 has been explained with reference to the rotary key 38 of FIG. 2. FIG. 8 illustrates three responses 305, 307, 309. A first response 305 which is the control voltage applied to the motion sensing apparatus of FIG. 6, as already highlighted this may be applied to a switching element within the apparatus, for example the FET 176 of FIG. 6. The first response 305 comprises three square like pulses 305*a* 305*b*, 305*c* each of 40 microsecond duration 306*a* having a duty cycle 306*b* of approximately 20 milliseconds. These times are typical. A second response 307 is the output from the motion sensing apparatus of FIG. 6 in response to the rotary key 300 being rotated. The second response 307 comprises three pulses 307*a*, 307*b*, 307*c* substantially coincidental with the three pulses 305*a*, 305*b*, 305*c* respectively. A first pulse 307*a* provided by said motion sensing apparatus interacting with sector 304*a*, a second pulse interacting with sector 302*a* and a third pulse interacting with sector 304*b*. Pulses 307*a*, 307*c* resulting from said motion sensing apparatus interacting with an absorptive sector of the rotary key 300; pulse 307*b* resulting from said motion sensing apparatus interacting with a reflective sector of the rotary key 300. Pulses 307*a*, 307*c* being substantially lower in magnitude than pulse 307*b*. A third response 309 is also the output of the motion sensing apparatus of FIG. 6 in response to the rotary key not being rotated, but remaining static. The third response comprises three pulses 309a, 309b, 309c substantially coincidental with the three pulses 305a, 305b, 305c respectively. All three pulses 309a, 309b, 309c provided by said motion sensing apparatus interacting with a reflective sector 302a of the rotary key 300.

It will be appreciated that in the example provided, when a user interacts with a moveable member the rotational movement of the rotary key may be much slower than that indicated above, i.e. there will be many pulses corresponding to response 305 before there is a change in magnitude as highlighted between the first 307a and second 307b pulses of response 307. The duty cycle 306b should be pre-determined such that motion sensing apparatus 30 of FIG. 2 is cyclically activated at a rate, which is greater than the movement between the adjacent sectors of said moveable member. Ideally the rate at which the motion sensing apparatus will be activated is at least twice the maximum rate of change between the adjacent sectors.

In an automated device user input may not be necessary and motion sensing apparatus may be used to determine movement which may be much quicker than could be achieved by a user moving a rotary key. The duration of the enabling pulses and the duty cycle should be chosen according to the maximum rate of rotation. It will be appreciated that the examples outlined above are satisfactory for manual movement but may be altered for automated movement.

Figure 9:
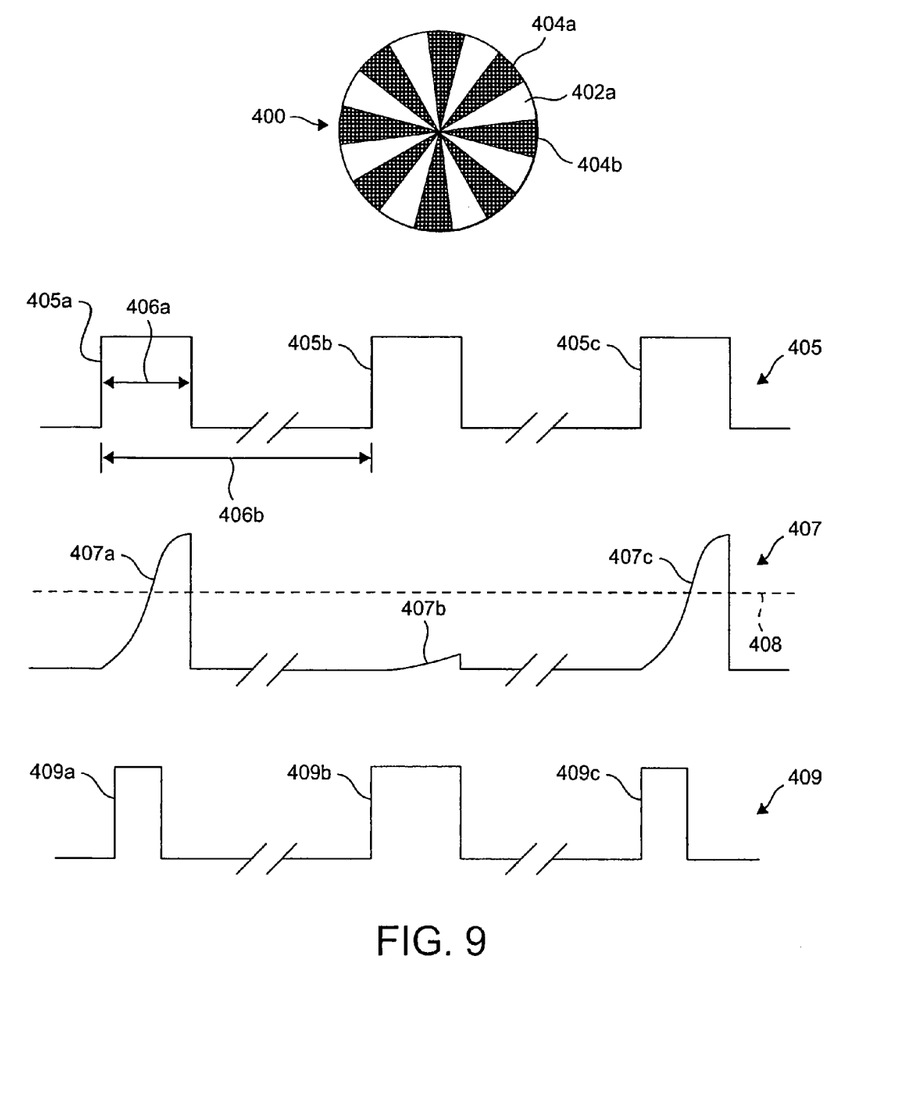
FIG. 9 illustrates the output of the motion sensing apparatus de-activating circuitry in response to the output response.

In a further embodiment motion sensing apparatus 30 of FIG. 2 may be de-activated in response to an output from said motion sensing apparatus. FIG. 9 illustrates the responses of motion sensing apparatus comprising such an embodiment. FIG. 9 illustrates rotary key 400 and three responses 405, 407 and 409. The rotary key 400 is the same as that illustrated by rotary key 300 in FIG. 8 and has corresponding reference numbers 400-404 respectively. A first response 405 is the same as the first response 305 of FIG. 8 and has corresponding reference numbers 305-306 respectively. A second response 407 is similar to the second response 307 of FIG. 8 but there is now a reference level 408, which has been set at an exemplary level of 1V. The reference voltage may be any suitable reference level but in a preferred embodiment the level has been set such that it is less than the peak output level from the motion sensing apparatus.

As outlined previously, as the rotary key 300 is rotated the response from the motion sensing apparatus 30 of FIG. 2 will result in two pulses each having a different magnitude as outlined by response 307 407 of FIGS. 8 and 9 respectively. A reference voltage level 408 should be chosen such that it is less than the maximum output response 407a and more than the minimum output response 407b. This motion sensing circuitry 30 may determine that a response, which has met the reference level 408, has resulted in an optical signal for example being reflected from a substantially reflective area 402a. Upon making such a determination there is no need for the motion sensing apparatus 30 to be biased and may be shut down.

An advantage of using a pre-determined reference level is that the motion sensing apparatus 30 may be deactivated before the end of the biasing pulse 405 in order for the hand portable electronic device to conserve current consumption. A further advantage is that the use of the reference voltage level 408 provides a means of determining which sector light has been reflected from without referring to any previous measurement from a previous cyclical activation.

Response 409 of FIG. 9 comprising pulses 409a, 409b and 409c outlines how a voltage supply rail may be biased in response to the output response 407. Contrasting responses 405, 407 and 409 it can be seen that the motion sensing apparatus 32 may be de-activated before the end of the control voltage response 405a in response to an output response 407a in order to save current consumption. The deactivation is seen when the output voltage 407a and 407c reach threshold value 408; then the bias voltage as represented by 409a and 409c is shut off. Since the threshold voltage 408 is not reached when light is incident on an absorptive region as shown by 407b, the bias voltage as represented by 409b remains on throughout.

Figure 10:
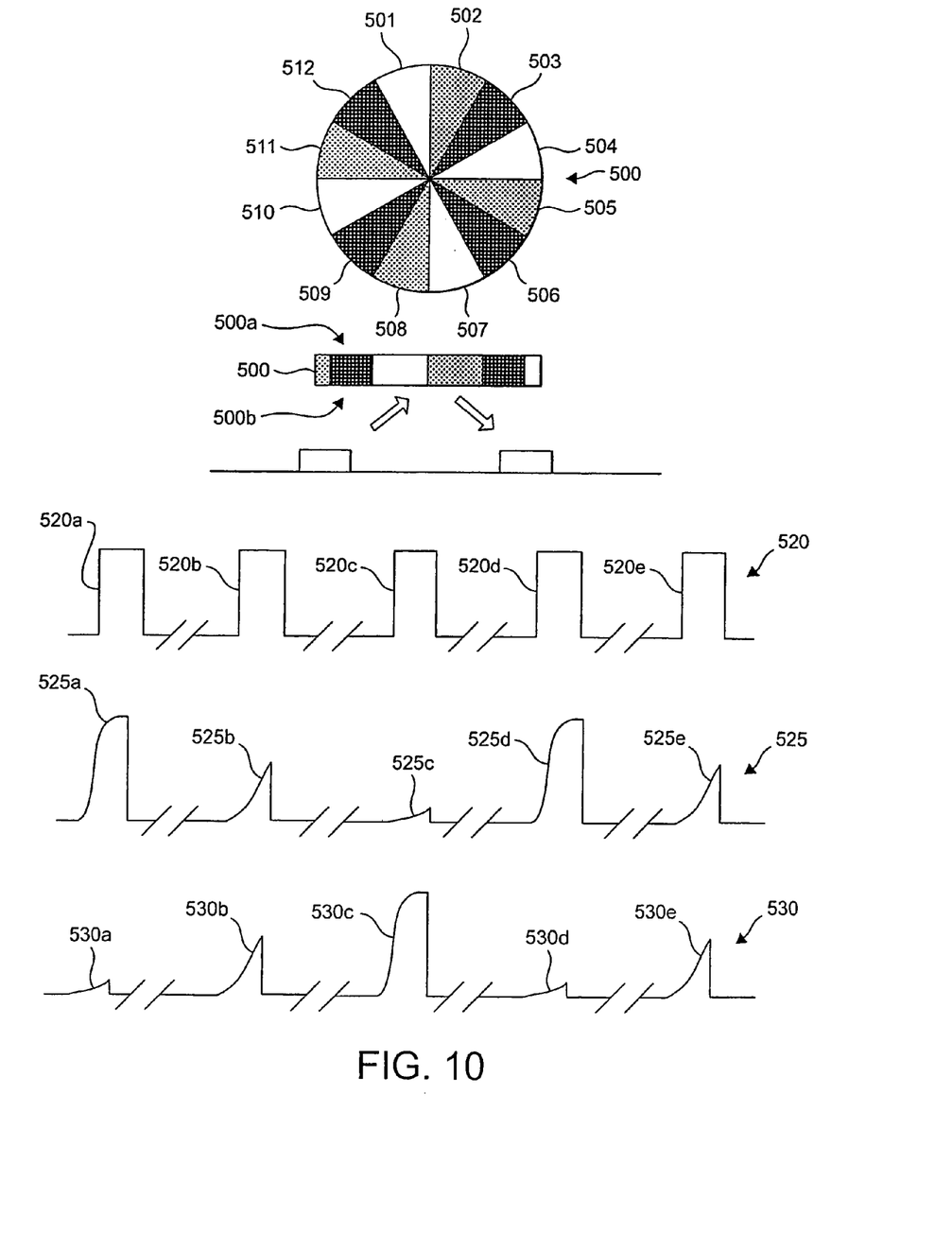
FIG. 10 shows the output response of the motion sensing apparatus in response to a rotary key being rotated comprising a directionally unique sequence.

In another embodiment there is motion sensing apparatus, which is responsive to a moveable member comprising a directionally unique sequence of characteristics. FIG. 10 illustrates a rotary key 500 comprising adjacent sectors 501, 502 . . . 512. The rotary key 500 comprising three different characteristics, reflective sectors 501, 504, 507 and 510; partially reflective sectors 502, 505, 508 and 511 and absorptive sectors 503, 506, 509 and 512. In alternative embodiments more than three characteristics may be used.

FIG. 10 also illustrates three responses 520, 525 and 530, which are outputs from the motion sensing circuitry 30 of FIG. 2 in response to the rotary key 38 comprising the pattern illustrated by rotary key 500 being rotated in accordance with the present invention. An upper surface of rotary key 500 that is visible to a user is identified by reference character 500a and a lower surface of rotary key that is not visible to a user is identified by reference character 500b. A first response 520 illustrates a control voltage applied to the motion sensing circuitry of FIG. 6; the first response 520 comprising five pulses 520a . . . 520e of equal duration and constant duty cycle although in alternative embodiments the duty cycle may not be constant and the pulses need not be regular. A second response 525 illustrates the output of the motion sensing circuitry 30 of FIG. 2 in response to different incident light levels being received in response to the rotary key 500 being rotated. Each pulse 525a . . . 525e being coincidental with the pulses 520a . . . 520e of the first response 520 respectively. The second response having a first pulse 525a, which has the highest magnitude, results form light being reflected from the reflective sector 501 of the rotary key 500. There is a second pulse 525b having a magnitude less than that of the first pulse 525a resulting from light being reflected from the partially reflective sector 502 of the rotary key 500; there is a third pulse 525c having a magnitude less than the first 525a and second 525b pulses resulting from light being reflected from the absorptive sector 503 of the rotary key 500. There is then a fourth pulse 525d which is the same as the first pulse 525a and a fifth pulse 525e which is the same as the second pulse 525b and this pulsing continues while the rotary key 500 is being rotated. It will be appreciated that the sequence illustrated with the second response 525 corresponds to a high, medium, low signals which then repeats and this is indicative of the rotary key 500 being rotated in a clockwise direction.

A third response 530 illustrates the sequence of pulses 530a . . . 530e when the rotary key 500 is rotated in a anti-clockwise direction; the sequence illustrated shows a repeating pattern of low, medium, high signals.

Figure 11:
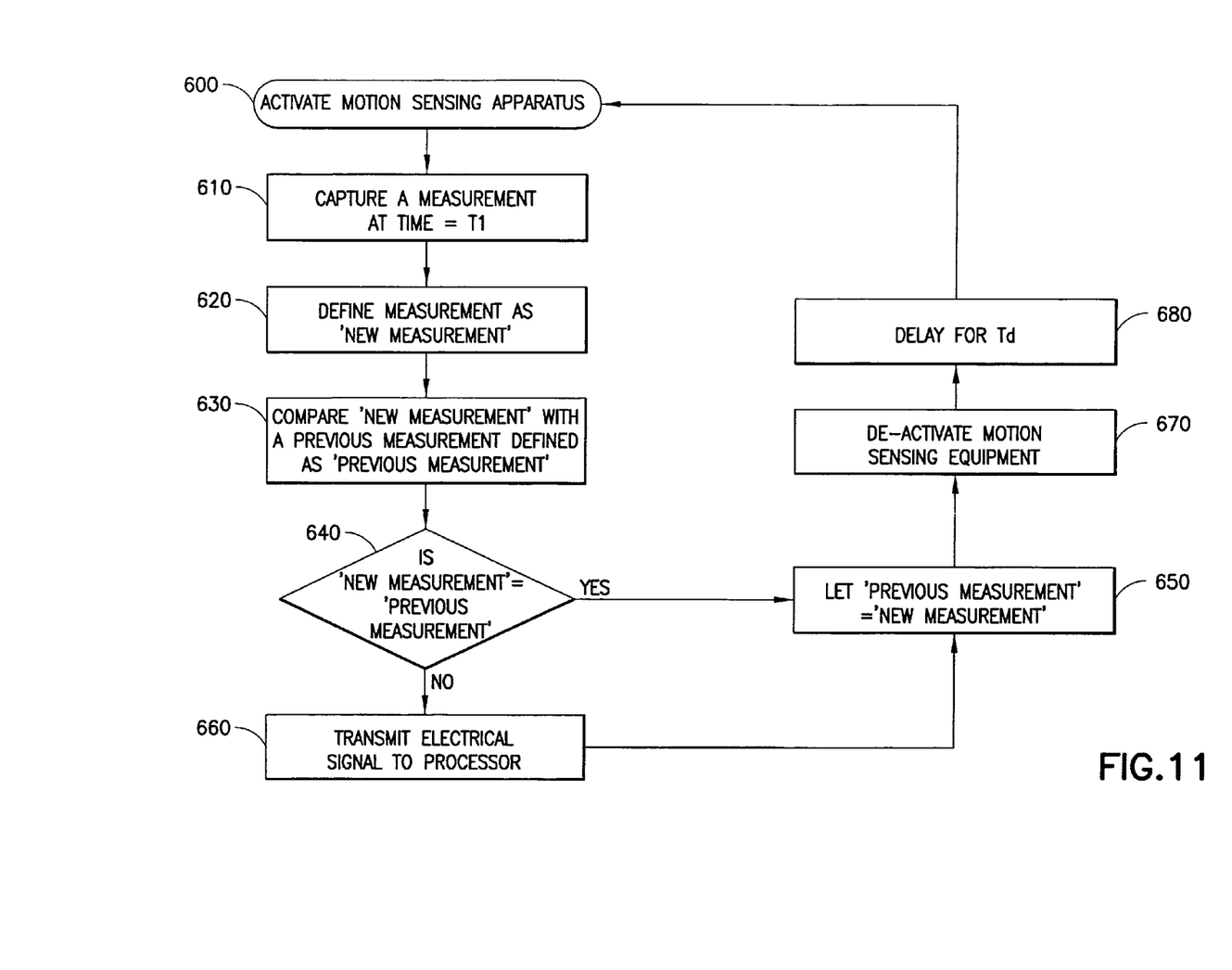
FIG. 11 shows a flowchart for outlining a method according to the present invention.

In accordance with another aspect of the invention FIG. 11 shows a flow chart outlining a method of operating the motion sensing apparatus of FIGS. 2 and 6. The operation starts from block 600, in which the motion sensing apparatus 30 is activated.

In block 610 a measurement is taken at a pre-defined time T1 which is less than or equal to the transient time of the apparatus in response to at least one input light level. Block 620 defines this measurement as 'new measurement' and this value can be stored in memory contained within the electronic device 10 of FIG. 1 for further computation.

In block 630 the 'new measurement' is compared with a previous measurement, which has been defined as 'previous measurement'. In should be noted that the 'previous measurement' corresponds with a measurement occurring during a previous cyclical activation; it could be the last activation or other preceding activation. In alternative embodiments it may be a combination of previous measurements.

In block 640 upon comparison of the 'new measurement' and 'previous measurement' a decision is made as to whether the measurements are the same. The comparison may be made on the assumption that the measurements are substantially the same in order to take account of external interference, such as ambient light or other EM interference. In an alternative embodiment the comparison may be made based on pre-defined levels such that the measurements must reach a pre-defined difference before they are not considered as being the same value.

In block 650 it has been decided with block 640 by means of the comparison that the 'new measurement' is equal to the 'previous measurement'. Within memory the 'new measurement' value is saved as the 'previous measurement value'; in an alternative embodiment the 'new measurement' may be used in combination with other previous measurements in order to determine the 'previous measurement' value.

In block 660 it has been decided within block 640 by means of the comparison that the 'new measurement' is not equal to the 'previous measurement'. The motion sensing apparatus 30 will then send an electrical signal to a processor so that this signal may be used in isolation or in combination with other signals, for example from another sensor, that movement has occurred.

As explained earlier the output from the block 660 flows into the block 650 and the 'previous measurement' value is updated.

In block 670 the motion sensing apparatus 30 is de-activated after a time T2. In an alternative embodiment the motion sensing apparatus may be de-activated immediately after a measurement is made in order to save power consumption but the memory and processor tasks may carry on computational tasks.

In block 680 a delay Td is applied, the summation of the time T2 and the time Td are equal to the duty cycle of the motion sensing apparatus. In alternative embodiments the duty cycle may not be fixed but can be variable, this could be achieved with a further input (not shown) in to the block 680 so as to vary the delay time td. After the delay time Td has elapsed the motion sensing apparatus is re-activated as block 600 and the cyclic action begins again.

The invention claimed is:

1. Motion sensing apparatus comprising a source of light pulses; a moveable member configured both to move and to modulate by movement the light pulses thereby creating light pulses at a first light level and light pulses at a second light level, wherein a transition from a light pulse at the first light level to a light pulse at the second light level is indicative of movement of the element; at least one light sensitive electronic component, said light sensitive electronic component responsive to at least the light pulses at the first and second light levels, the pulses at the first and second light levels creating in said light sensitive electronic component first and second responses, respectively, each response having a first response portion and a second response portion, the response portions associated with light pulses at the first light level different from the response portions associated with light pulses at the second light level, wherein the apparatus is configured to sense movement of the moveable member by detecting a transition in the response of the light sensitive electronic component from a response corresponding to the first response portion associated with a light pulse at the first light level to a response corresponding to the first response portion associated with a light pulse at the second light level.

2. Motion sensing apparatus according to claim 1 wherein the first response portions are dynamic and the second response portions are substantially constant for a constant incident light level.

3. Motion sensing apparatus according to claim 2 wherein said motion sensing apparatus is cyclically activated.

4. Motion sensing apparatus according to claim 3 wherein the transition is detected by comparing the response of the light sensitive electronic component to a previously recorded value corresponding to a first response portion associated with a light pulse at one of the light levels.

5. Motion sensing apparatus according to claim 4 wherein the previously recorded value has a pre-defined value.

6. Motion sensing apparatus according to claim 4 wherein the moveable member further comprises a pattern of alternating characteristics for modulation of incident light pulses.

7. Motion sensing apparatus according to claim 6 wherein said pattern comprises at first and second sectors having different reflectivities.

8. Motion sensing apparatus according to claim 7 wherein said interaction comprises said incident light pulses having been reflected from said moveable member.

9. Motion sensing apparatus according to claim 8 wherein said moveable member is a rotary key.

10. Motion sensing apparatus according to claim 8 wherein said moveable member is a slideable key.

11. Motion sensing apparatus according to claim 6 wherein said pattern comprises a directionally unique sequence.

12. Motion sensing apparatus according to claim 1 wherein said source of light pulses outputs light pulses having a defined light level.

13. Motion sensing apparatus according to claim 12 further comprising a switching element arranged to activate or deactivate at least one of said source of light pulses and light sensitive electronic component.

14. Motion sensing apparatus according to claim 13 wherein said deactivation occurs before the expiration of said first response portion for at least one of said incident light levels.

15. Motion sensing apparatus according to claim 14 wherein said motion sensing apparatus is deactivated following the measuring of said response.

16. Motion sensing apparatus according to claim 1 wherein said motion sensing apparatus comprises two light sensitive electronic components.

17. Motion sensing apparatus according to claim 1 wherein said motion sensing apparatus comprises two sources of light pulses.

18. An electronic device comprising a motion sensing apparatus according to claim 1.

19. A method comprising:
  illuminating a moveable member with light pulses, wherein the moveable member has a pattern of regions alternating between at least a first reflectivity and a second reflectivity, wherein the regions alternate in a same direction as a direction of movement of the moveable member;

gathering light pulses reflected from the moveable member with a light sensitive electronic component, wherein the gathered light pulses generate a first response in the light sensitive electronic component when reflected from a region of the first reflectivity and a second response in the light sensitive electronic component when reflected from a region of the second reflectivity, the first and second responses each having a transient response portion and a steady state response portion, at least the transient response portions of the first and second responses different from one another;

serially comparing responses generated in the light sensitive electronic component by the gathered light pulses to a reference response, the reference response corresponding to the first transient response;

detecting a transition in the response of the light sensitive electronic component when a result of the comparison changes between a first comparison and a second comparison later in time; and sensing movement of the moveable element by detecting the transition in the response of the light sensitive element wherein the transition in the response indicates that the moveable element has moved to a position where the light pulses are being reflected by a region having a different reflectivity.

20. A method according to claim 19 said method further comprising cyclically activating motion sensing apparatus.

21. A method according to claim 19 wherein said reference response is a numerical value stored in memory.

22. A method according to claim 20 wherein said reference response is associated with a measurement made during a previous cyclical activation.

23. A computer program product comprising a computer readable memory medium storing a computer program for controlling motion sensing apparatus, the computer program, when executed, configured to cause a light source to emit light pulses, the light pulses to be reflected by a moveable member, where the moveable member has a pattern of regions alternating between at least a first reflectivity and a second reflectivity, and wherein the regions alternate in a same direction as the direction of movement of the moveable member; to control a light sensitive electronic component to gather responses to light pulses reflected by the moveable member, the light pulses generating a first response in the light sensitive electronic component when reflected from a region of the first reflectivity and a second response in the light sensitive electronic component when reflected from a region of the second reflectivity, the first and second responses each having a transient response portion and a steady state response portion, at least the transient response portions of the first and second responses different from one another; to serially compare responses generated in the light sensitive electronic component by the gathered light pulses to a reference response, the reference response corresponding to the first transient response; to detect a transition in the response of the light sensitive electronic component when a result of the comparison changes between a first comparison and second comparison later in time; and to sense movement of the moveable member by detecting the transition in the response of the light sensitive electronic component, wherein the transition in response indicates tat the moveable member has moved between positions where the light pulses are being reflected by regions having different reflectivities.

24. A computer program product according to claim 23 further comprising: computer executable program code for cyclically activating the motion sensing apparatus.

* * * * *

UNITED STATES PATENT AND TRADEMARK OFFICE
CERTIFICATE OF CORRECTION

PATENT NO.        : 7,265,337 B2
APPLICATION NO.   : 11/166001
DATED             : September 4, 2007
INVENTOR(S)       : Steve Doe Page 1 of 1

It is certified that error appears in the above-identified patent and that said Letters Patent is hereby corrected as shown below:

Column 14, line 27

Delete "tat" and replace with --that--.

Signed and Sealed this

Fourth Day of March, 2008

JON W. DUDAS
*Director of the United States Patent and Trademark Office*